United States Patent [19]

Sueoka et al.

[11] Patent Number: 5,274,592
[45] Date of Patent: Dec. 28, 1993

[54] SEMICONDUCTOR INTEGRATED CIRCUIT DEVICE FOR HIGH-SPEED TRANSMISSION OF DATA AND FOR IMPROVING RELIABILITY OF TRANSFER TRANSISTOR, APPLICABLE TO DRAM WITH VOLTAGE-RAISED WORD LINES

[75] Inventors: Atsushi Sueoka, Yokohama; Katsushi Nagaba, Kawasaki; Hiroyuki Koinuma, Yokohama, all of Japan

[73] Assignee: Kabushiki Kaisha Toshiba, Kawasaki, Japan

[21] Appl. No.: 805,560

[22] Filed: Dec. 13, 1991

[30] Foreign Application Priority Data

Dec. 13, 1990 [JP] Japan ................... 2-402053

[51] Int. Cl.⁵ .............................................. G11C 7/00
[52] U.S. Cl. ............................. 365/189.11; 365/189.07
[58] Field of Search ............ 365/189.11, 189.09, 365/189.07, 204, 230.06, 233; 307/578

[56] References Cited

U.S. PATENT DOCUMENTS

| | | | |
|---|---|---|---|
| 4,503,522 | 3/1985 | Etoh | 365/189.11 |
| 4,771,406 | 9/1988 | Oishi | 365/222 |
| 4,896,297 | 1/1990 | Miyatake | 365/189.11 |
| 4,967,395 | 10/1990 | Watanabe | 365/189.07 |
| 5,075,890 | 12/1991 | Itoh | 365/189.11 |
| 5,093,586 | 3/1992 | Asari | 365/189.11 |
| 5,119,334 | 6/1992 | Fujii | 365/189.11 |
| 5,121,007 | 6/1992 | Aizaki | 365/189.11 |
| 5,124,574 | 6/1992 | Ibaraki | 365/189.09 |

Primary Examiner—Eugene R. LaRoche
Assistant Examiner—A. Zarahian
Attorney, Agent, or Firm—Foley & Lardner

[57] ABSTRACT

A semiconductor integrated circuit device having a high-efficiency transfer gate and which is applicable to a DRAM which has voltage-raised word lines configured from a data retention node, a data line that is precharged to a required level, a MOS transistor with the source and the drain each connected to a data line and a data retention node, a sense amplifier that amplifies the data that has been transferred to the data line via this MOS transistor a step-up circuit that applies a voltage that is higher than the drain voltage when compared with an absolute value, to the gate of the MOS transistor, and a step-down circuit for reducing the absolute value of a gate voltage of the MOS transistor at the timing of activation of the sense amplifier.

8 Claims, 3 Drawing Sheets

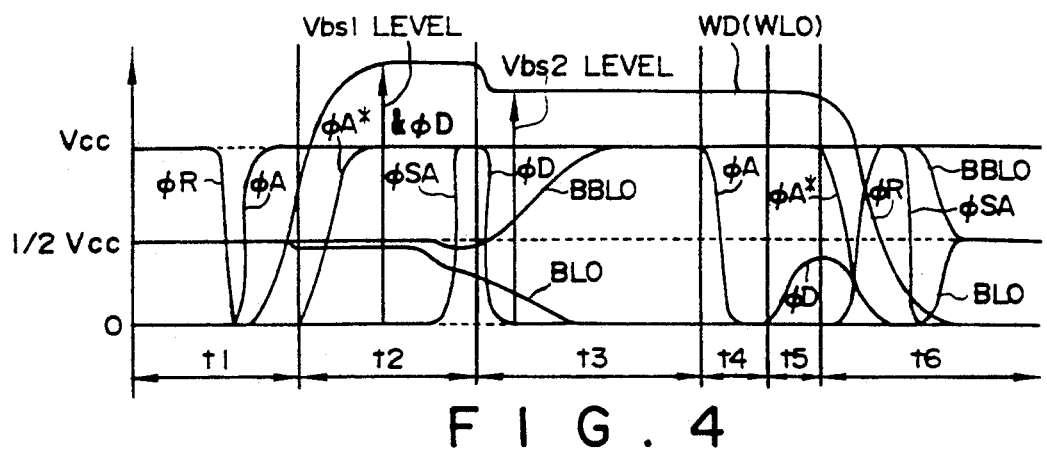
F I G. 4
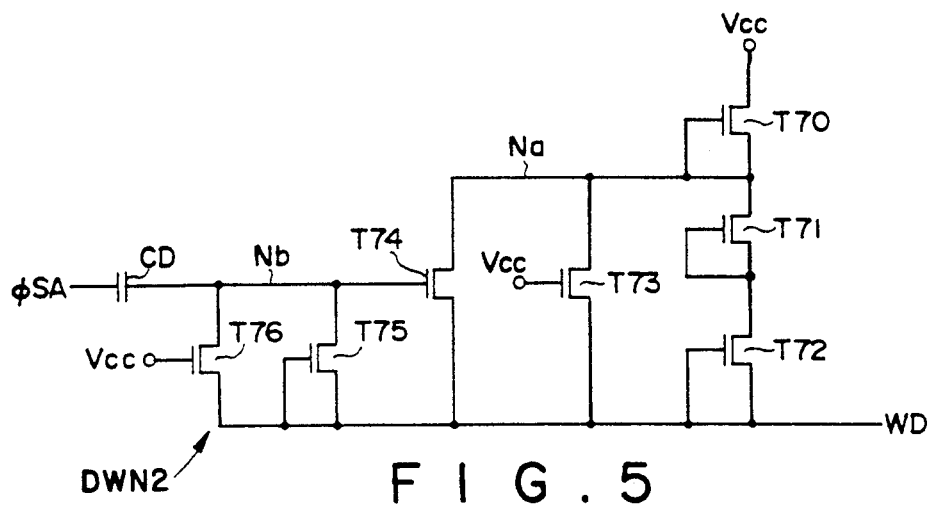
F I G. 5
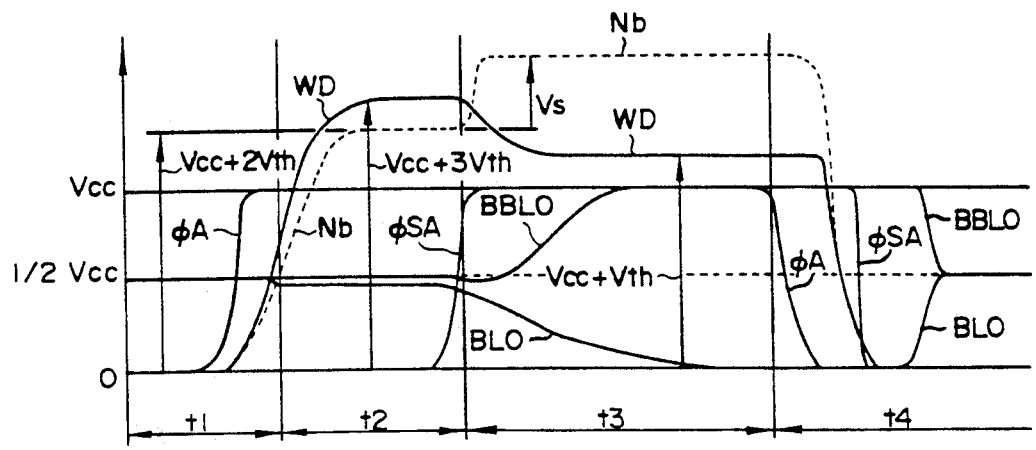
F I G. 6

SEMICONDUCTOR INTEGRATED CIRCUIT DEVICE FOR HIGH-SPEED TRANSMISSION OF DATA AND FOR IMPROVING RELIABILITY OF TRANSFER TRANSISTOR, APPLICABLE TO DRAM WITH VOLTAGE-RAISED WORD LINES

BACKGROUND OF THE INVENTION

The present invention relates to semiconductor integrated circuit devices which are applicable to dynamic random access memories (DRAM) for which the word line voltage is raised, and more particularly, relates to semiconductor integrated circuit devices that can be compatible with high-speed transmission of data and an improvement of reliability of a transfer transistor by changing a step-up level in a gate of the transfer transistor before and after activation of a sense amplifier.

One known type of semiconductor integrated circuit device is provided with a data retention node $N_D$, a data line DL that is precharged to a required voltage, a sense amplifier connected to this data line DL, a data retention node $N_D$ having a source and a drain, an NMOS transistor (hereinafter termed a transfer transistor) connected to the data line DL, and a voltage raise circuit connected to a gate of this NMOS transistor. In this semiconductor integrated circuit device, the data transfer between the node $N_D$ and the data line DL is performed by the following procedure.

First, in order to output the data of the node $N_D$ to the data line DL, the gate of the transistor that is 0 V at the start of the operating period is made a high potential by the voltage raise circuit and when this occurs, the transistor turns on and there is an electrical connection between the node $N_D$ and the data line DL. By this, the data of the node $N_D$ changes the potential of the data line DL from the precharge potential. After this, the sense amplifier is activated and the level change of the data line is amplified, and the data line is then either high or low. Data is output from the node $N_D$ to the data line DL when there is this status.

After this, data is input to the node $N_D$ via the data line DL. If the gate of the transistor is held as it is at this potential, then the node $N_D$ and the data line DL are electrically connected by a transfer transistor and so the data of node $N_D$ becomes the same as that of the data line DL. If the data of the data line DL is inverted, then data that is the same as the data that was output from the node $N_D$ to the data line DL with the prior transfer, is transferred from the data line DL to the node $N_D$, and if the data of the data line is inverted by an input circuit, then the reverse data is transferred to the node $N_D$. When the transfer operation finally ends, the gate voltage is made 0 V, and the transfer transistor turns off, and the node $N_D$ and the data line DL are electrically interrupted, and the data line DL is charged to a predetermined voltage and preparations are made for the next data transfer.

A typical type of transfer transistor as described above is a DRAM memory cell transistor. The following is a description of an example of this. FIG. 1 is a view of a conventional semiconductor integrated circuit device. This semiconductor integrated circuit device is a DRAM, and for the purpose of simplicity of description, has only a memory cell with two lines and one column. The memory cell comprises one transistor and one capacitor, and the respective memory cells are termed MC0, MC1, and the transistor and the capacitor that configure each memory cell are termed TM0, CM0, TM1, CM1. Moreover, the data retention node $N_D$ is formed by the nodes $N_{D0}$ and $N_{D1}$ provided to the cells $M_{C0}$ and $M_{C1}$. The memory cell transistor TM0 has the gate connected to the word line WL0, and the source and the drain connected between the bit line BL0 and the capacitor CM0. In the same manner, the memory cell transistor TM1 has the gate connected to the word line WL1, and the source and the drain connected between the bit line BBL0 and the capacitor CM1. Moreover, the initial character "B" of the bit line BBL0 means an "inversion" and the bit line BBL0 transfers data which are inverted with respect to the data that are transferred by the bit line BL0. The bit lines BL0 and BBL0 are connected to the sense amplifier SA, and the word lines WL0, WL1 are connected to the output node WD of the word line voltage raise circuit WLDV via the decoder DC. The word line voltage raise circuit WLDV has a transistor T10 that has either the source or the drain connected to a positive voltage $V_{cc}$, and the other connected to the output node of the word line voltage raise circuit WLDV, and a transistor T20 that has either the source or the drain grounded, and the other connected to the output node of the word line voltage raise circuit WLDV and inputs the reset signals $\phi_R$ to the gate. The active signal $\phi_A$ are transmitted to the inverter INV1 via an inverter INV2, and the output of the inverter INV1 is supplied to one electrode $\phi_A^*$ of a voltage raise capacitor CB1 via the inverter INV2. The other electrode of the voltage raise capacitor CB1 is connected to the output node of the word line voltage raise circuit WLDV.

The following is a description of the operation for the transfer of the data of the memory cell MC0 of the DRAM shown in FIG. 1, to the bit line via the transfer transistor TM0. Here, it is assumed that low data is stored in the memory cell MC0, and that bit lines BL0, BBL0 are precharged to the level of ½ of the operating voltage $V_{cc}$. To broadly describe the flow operation, the word line WL0 connected to the memory cell MC0 which is to be activated is pulled up from the ground level to above the level of the operating voltage $V_{cc}$. When this occurs, the memory cell transistor TM0 conducts and the charge that was stored in the capacitor CM0 flows to the bit line BL0, and the potential of the bit line BL0 drops slightly. When this slight difference in the potential is amplified by the sense amplifier SA, the result is that the bit line BL0 becomes the ground level and the cell data is read.

The start of the read operation creates a potential of greater than the $V_{cc}$ level by the word line voltage raise circuit WLDV, and the output WD of the word line voltage raise circuit WLDV is transmitted to the object word line WL0 for which the address A has been received from the decoder DC. By making the reset signal $\phi_R$ low and making the active signal $\phi_A$ the $V_{cc}$ level, the transistor T10 turns on and T20 turns off and the output WD of the word line voltage raise circuit WLDV becomes equal to the level of $V_{cc}-V_t$ (refer to the period t1 of FIG. 2). Here, $V_t$ is the threshold value of the transistor T10. The active signals $\phi_A$ are transmitted to one electrode of the voltage raise capacitor CB1 via the delay circuit DLY, the inverter INV1 and the INV2, and $\phi_A$ changes to high signals that have a delay. When this occurs, the output WD of the word line voltage raise circuit WLDV rises from the recharged level to the high potential at the period t2 shown in FIG. 2, because of the coupling of the capacitor CB1. In parallel with this operation, the decoder DC receives the address A and the word line WL0 is selected, and the output WD of the word line voltage raise circuit WLDV is transmitted to the word line, and the word line WL0 becomes the voltage raised level $V_b$ (refer to period t2 of FIG. 2).

When the level of the word line WL0 exceeds the threshold value of the memory cell transistor TM0, the transistor TM0 turns on and the data that was stored in the capacitor CM0 flows to the bit line BL0, and the potential of the bit line BL0 makes the sense amplifier activation signals $\phi_{SA}$ high and activates them, and the level change of the bit line BL0 is amplified, and becomes the ground level (with BBL0 become the $V_{cc}$ level). In this status, the cell data is read to the bit line (refer to period t3 of FIG. 2).

The gate (word line WL0) of the cell transistor is held at the high potential and so the potential of the bit line BL0 is written to the cell capacitor CM0 via the cell transistor TM0. If the data of the bit line BL0 is not inverted, then low data is written to the cell capacitor CM0, and if the data of the bit line BL0 is inverted, then high data is written to the cell capacitor CM0.

In the reset Operation, when the active signal $\phi_A$ becomes the ground level, the transistor T10 turns off. Also, that for which the active signal $\phi_A$ is low is received and is delayed and $\phi_A^*$ becomes low, and because of the coupling of the capacitor CB1, the level of the word line WL0 and the output WD drops to the vicinity of $V_{cc}$. At the same time, when the reset signals $\phi_R$ becomes high, when levels of the word line WL0 and the output node WD become the ground level, and the memory cell transistor TM0 turns off and the bit line BL0 and the cell capacitor CM0 are both in the status where they are electrically interrupted (refer to the period t4 of FIG. 2).

The description here assumes that the transfer transistor is an NMOS transistor but the same can be said when it is a PMOS transistor. However, the situation for a PMOS transistor is self evident from the description for an NMOS transistor and so the description of this situation is omitted here. For the same reason, the following description will be for the case of an NMOS transistor only, and is not meant to imply that the present invention is applicable only to transfer transistors that use NMOS transistors.

A transfer transistor must transfer data quickly to a data line that has been precharged. Because of this, the voltage rise potential that is applied to the gate can be as high a voltage as possible. However, this level must be controlled to the degree that there is no destruction of the gate oxide film.

FIG. 1 shows a DRAM for the times when a high voltage is applied to the gate oxide film of a transfer transistor. When the word line WL0 becomes the raised voltage level $V_b$, the cell data is output to the bit line BL0 (refer to period t2 of FIG. 2). At this time, the gate-source voltage $V_{gs}$ of the cell transistor TM0 becomes $$V_{gs} = V_b - V_{cc}/2$$

The potential that is applied to a transfer transistor by the precharge voltage of the bit line even if the gate has had its voltage raised to a high potential is lessened. Following this, when the sense amplifier is activated and the bit line level change is amplified (refer to period t3 of FIG. 2), and in the worst case for when there is the output of low data $$V_{gs} = V_b - 0$$

and instead of the voltage raised level of the transfer transistor staying at the voltage raised level, a maximum field is applied to the gate oxide film for this period.

On the other hand, at the period t2 of FIG. 1, it is desirable that the word line voltage raised level be made to as high a potential as is possible, the conductance of the transfer transistor is raised, and the cell data output to the bit line at high speed. On the other hand, at the period t3 of FIG. 1, the raised level of the word line has to be low enough so as not to destroy the gate oxide film. In a conventional semiconductor integrated circuit device, after the sense amplifier has been activated in this manner, there is a high potential difference and so the voltage raise level has to be suppressed. More specifically, there is the danger of destruction of the gate oxide film, and it is not possible to sufficiently raise the transfer efficiency.

SUMMARY OF THE INVENTION

The present invention has as an object to provide a sufficient voltage raising of the gate voltage for a transfer transistor prior to activation of the sense amplifier, and voltage dropping that level after activation of the sense amplifier and therefore providing a semiconductor integrated circuit device that has a high transfer efficiency, and that also has no danger of the destruction of the gate oxide film.

The semiconductor integrated circuit device of the present invention is characterized in being provided with a data retention node, a data line that is precharged to a required level, a MOS transistor with the source and the drain each connected to a data line and a data retention node, a sense amplifier that amplifies the data that has been transferred to the data line via this MOS transistor, a step-up circuit that applies a voltage which is higher than the drain voltage when compared with an absolute value, to the gate of the MOS transistor, and a step-down circuit for reducing the absolute value of a gate voltage of a MOS transistor at the timing of activation of the sense amplifier.

According to a semiconductor integrated circuit device having the configuration as described above, it is possible to reduce the absolute value of the gate voltage of an MOS transistor at the timing of activation of a sense amplifier. By this, it is possible to raise the transfer efficiency and to prevent the destruction of the gate oxide film.

BRIEF DESCRIPTION OF THE DRAWINGS

In the appended drawings:

FIG. 4 is a timing chart for describing the operation of a semiconductor integrated circuit device of a first embodiment according to the present invention;

FIG. 5 is a block diagram for describing the configuration of a semiconductor integrated circuit device of a second embodiment according to the present invention; and FIG. 6 is a timing chart for describing the operation of a semiconductor integrated circuit device of a second embodiment according to the present invention.

DETAILED DESCRIPTION OF THE PREFERRED EMBODIMENTS

The following is a detailed description of preferred embodiments of the present invention, with a first embodiment being described with reference to FIGS. 3 and 4, and a second embodiment being described with reference to FIGS. 5 and 6.

Figure 3:
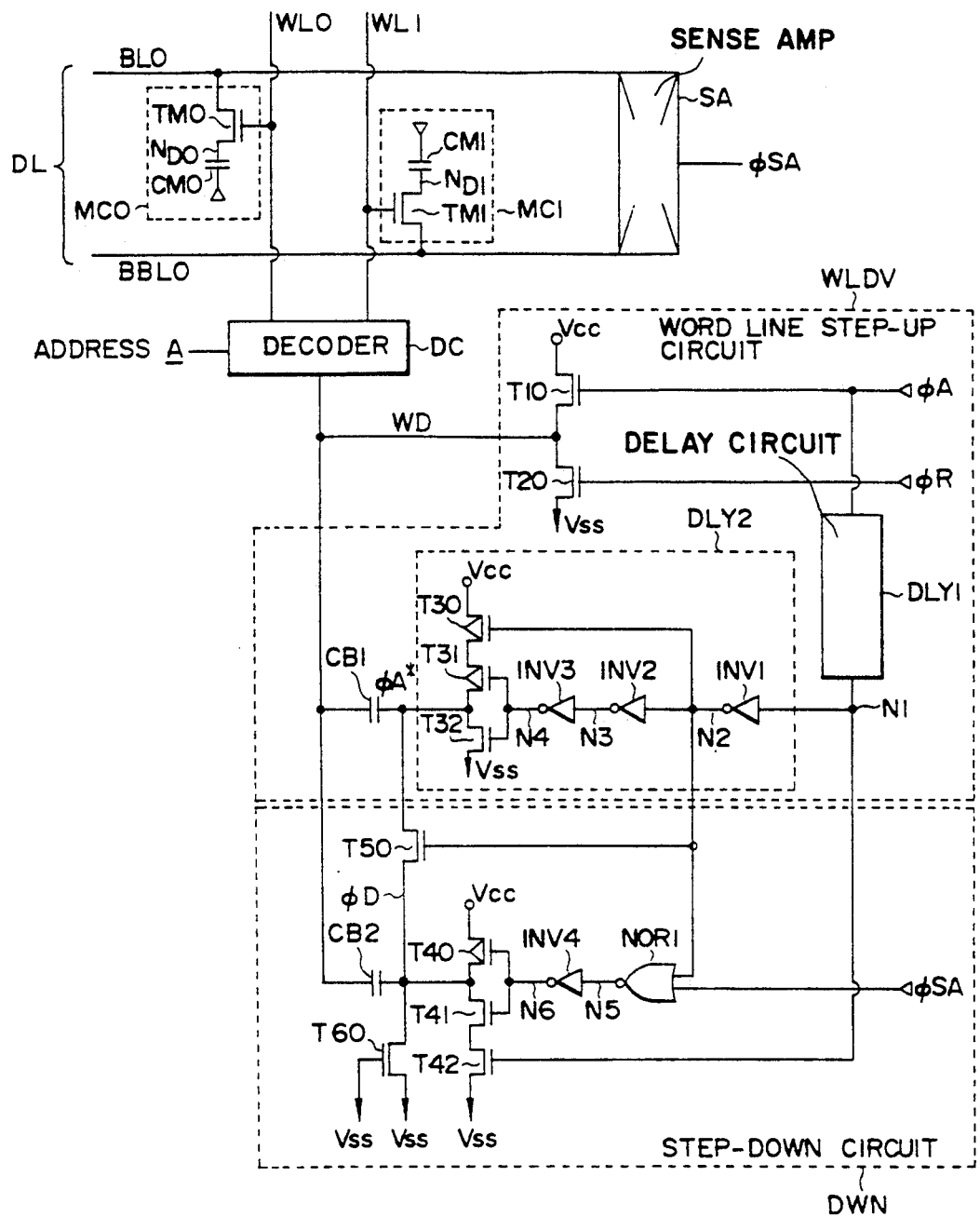
FIG. 3 is a block diagram for describing the configuration of a semiconductor integrated circuit device of a first embodiment according to the present invention.

FIG. 3 is a block diagram for describing the configuration of a semiconductor integrated circuit device of a first embodiment according to the present invention. This semiconductor integrated circuit device has a different configuration for the word line voltage raising circuit WLDV from the conventional semiconductor integrated circuit device shown in FIG. 1, and the output node WD of the word line voltage raising circuit WLDV also has a voltage lowering circuit DWN that lowers the voltage at the timing of the activation of the sense amplifier.

Figure 1:
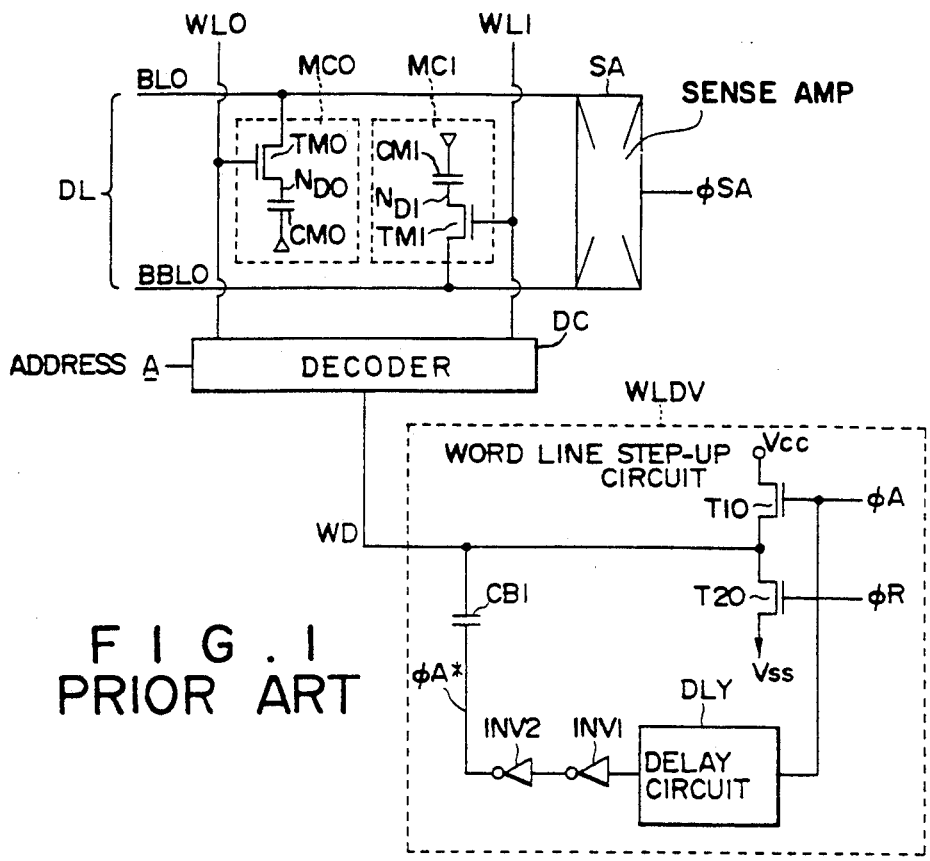
FIG. 1 is a view of a conventional semiconductor integrated circuit device.
Figure 2:
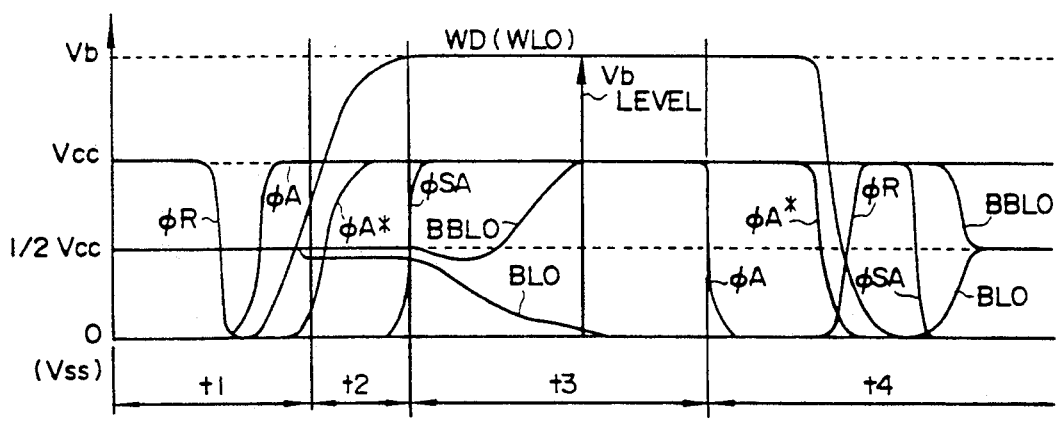
FIG. 2 is a timing chart for describing the operation of the conventional semiconductor integrated circuit device shown in FIG. 1.

In the same manner as the conventional circuit shown in FIG. 1, the word line voltage raising circuit WLDV is connected in series between the power supply $V_{cc}$ and the ground $V_{ss}$, and has the NMOS transistors T10 and T20, to the gates of which are respectively input the active signals $\phi_A$ and the reset signal $\phi_R$, and which output to the node WD that is connected to both T10 and T20. Then, the delay circuits DLY1 and DLY2 make the signal $\phi_A^*$ which is the active signal $\phi_A$ which has been delayed, and applies this to one electrode of the voltage raise capacitor CB1. The other electrode of the capacitor CB1 is connected to the output WD. The delay circuit DLY2 comprises the three inverter stages INV1, INV2 and INV3, NMOS transistors T32, and the PMOS transistor T30, T31 connected in series between the power supply $V_{cc}$ and the ground $V_{ss}$. The gate of the transistor T30 is connected to the output node N2 of the inverter INV1 and the gate of the transistors T31 and T32 are connected to the output node N4 of the inverter INV3.

The voltage lowering circuit DWN has a NOR circuit NOR1 that inputs the sense amplifier activation signal $\phi_{SA}$ and the output node N2 of the inverter outputs to the node N5, an inverter INV4 that receives the output of the NOR circuit NOR1, a PMOS transistor T40 that is connected in series between the power supply $V_{cc}$ and the ground $V_{ss}$, and the NMOS transistors T41 and T42. The gates of the transistors T40 and T41 are connected to the output N6 of the inverter INV4, and the gate of the transistor T42 is connected to the output N1 of the delay circuit DLY1. Furthermore, there is also provided an NMOS transistor T60 that connects the source to the node $\phi_D$, and the gate and the drain to the ground $V_{ss}$, and an NMOS transistor T50 that connects the source and the drain across $\phi_A^* - \phi_D$, and the gate to the node N2, and a voltage raising capacitor CB2 connected between the node $\phi_D$ that mutually connects the output WD of the word line voltage raising circuit WLDV and the transistors T40 and T41.

The following is a description of the operation of the semiconductor integrated circuit device shown in FIG. 3. When the active signal $\phi_A$ changes from the ground ($V_{ss}$) level to the $V_{cc}$ level, and the reset signal $\phi_R$ changes to the ground level, the transistor T10 turns on and the transistor T20 turns off and the output node WD of the word line voltage raising circuit WLDV is charged to the level $V_{cc} - V_t$ (period t1 of FIG. 4). Here, $V_t$ is the threshold value of the transistor T10. The delay signal $\phi_A^*$ of the active signal $\phi_A$, and $\phi_D$ are made in parallel with the recharging of the output node WD. When the active signal $\phi_A$ becomes high, then the node N1 also becomes high level along with the delay by the delay circuit DLY1. When the node N1 changes to high, the node N2 becomes low because of the inverter INV1. At this time, the transistors T30 and T42 turn on, and the transistors T30, T31 and T32 and transistors T40, T42 and T42 form respective inverters and the transistor T50 is off. Then, the sense amplifier activation signal $\phi_{SA}$ is not high and so the NOR circuit NOR1 is the same as an inverter and when the node N2 changes to low, the delay of the three stage inverter make the delay signals $\phi_D$. Here, $\phi_A^*$ and $\phi_D$ raise high at the same time. At this time, one electrode of the capacitors CB1 and CB2 is 0 V and so the voltage changes to that of the $V_{cc}$ level and so the output WD of the word line voltage raising circuit WLDV rises to the level of $V_{bs1}$ because of the coupling. Then, the decoder DC receives the address and the voltage raised level is transmitted to the selected word line, that is, the WL0 (period t2 of FIG. 4).

If the level of the word line WL0 is not $V_{bs1}$, then the memory cell transistor TM0 turns on and the charge that is stored in the memory cell capacitor CM0 flows to the bit line BL0. If that data is LOW, then the bit line BL0 drops slightly from the precharge level $V_{cc}/2$. After this, the sense amplifier is activated by $\phi_{SA}$ becoming high, then the bit line BL0 is made the ground level ($V_{ss}$) and the bit line BL0 that is inverted by the signal level becomes the $V_{cc}$ level. In addition, the output node N5 of the NOR circuit NOR1 becomes low, and the voltage drop signal $\phi_D$ changes to low via the two stages of inverter. The node WD that receives this is pulled down from $V_{bs1}$ to $V_{bs2}$ by the coupling of the capacitor CB2 (t3 of FIG. 4). The level of this $V_{bs2}$ is set to be greater than the sum of the threshold values of the transistor TM0 and level of data high ($V_{cc}$) and the potential of the bit line BL0 is written to the cell capacitor CM0 via the cell transistor TM0.

The word line is held at the level of $V_{bs2}$ and so the potential of the bit line BL0 is written to the cell capacitor CM0 via the cell transistor TM0. Low data is written if the data of the bit line BL0 is not inverted by the input circuit, and high data is written if the data of the bit line BL0 is not inverted by the input circuit, and high data is written if the low data is inverted.

The reset operation starts When the active signal $\phi_A$ becomes low (period t4 of FIG. 4) and when $\phi_A$ becomes low, the node N1 becomes low accompanying the delay of the delay circuit DLY1, and the NMOS transistor T42 turns off. After this, the low of the node N1 is received and the inverter INV1 makes node N2 high, and PMOS transistor T30 turns off, and the NMOS transistor T50 turns on.

At this time, the potential of the node $\phi_D$ that first became low at prior t3 rises due to the NMOS transistor T50 because it is electrically connected to the node $\phi_A^*$ (period t5 of FIG. 4), and a period t4, the PMOS transistor T30 and the NMOS transistor T42 turn off so as to prevent the formation of the current flow path $V_{cc} \rightarrow T30 \rightarrow T31 \rightarrow T50 \rightarrow T41 \rightarrow T42 \rightarrow V_{ss}$ when the transistor T50 is turned on.

The NMOS transistor T32 turns on at the delay of the two stage inverter from the high of the node N2 and discharges until the node $\phi_A{}^*$ and the node $\phi_D$ become 0 V. This is received and the node WD and the word line WL0 drop to a level close to $V_{cc}$ due to the coupling of the capacitor CB1, and furthermore, when the reset signal $\phi_R$ becomes high, transistor T20 is turned on, and these become the ground level. When the word line WL0 becomes low, the memory cell transistor TM0 turns off and the capacitor CM0 is electrically interrupted from the bit line BL0.

At the start of the period t5, the node $\phi_D$ and the node $\phi_A{}^*$ are shorted and the purpose of this and the reason for adding the NMOS transistor T60 to the node $\phi_D$ is as described below.

At the start of the period t3, the node $\phi_D$ is low. If there were no transistors T50 and T60, then the reset signal $\phi_R$ would become high so that when the node WD and the word line WL0 are discharged to 0 V, this node $\phi_D$ would be drawn to a negative potential because of the capacitor CB2.

The node $\phi_D$ is connected to the drain of the NMOS transistor T41 and the potential of the node $\phi_D$ becomes a negative level which is lower than the bias potential of the P-well, the PN junction becomes successively biased, and the carriers are injected into the P-well. In the case of a DRAM, this means that the cell data can be destroyed more easily.

For the reason described above, at the period t5, the node $\phi_D$ and the node $\phi_A$ are shorted, and the potential of the node $\phi_D$ is raised. IN addition, the NMOS T60 is appended, and when the node $\phi_D$ is heading towards a negative level, the current from $V_{ss}$ flows and suppresses the drop of the potential. In the semiconductor integrated circuit device of this embodiment, the word line level is set so that it is divided into the two levels of $V_{bs1}$ and $V_{bs2}$ before and after sense amplifier activation. By this, if the level of $V_{bs2}$ is set to a level whereby the gate oxide film is not destroyed, $V_{bs1}$ can be set higher than the conventional step-up level $V_{bs1}$ and so it is possible to raise the transfer efficiency without losing reliability.

The following is a description of a second embodiment of a semiconductor integrated circuit device according to the present invention, with reference to FIGS. 5 and 6. The semiconductor integrated circuit device of this second embodiment has a voltage drop circuit DWN2 of FIG. 5 added to the conventional semiconductor integrated circuit device shown in FIG. 1. This voltage drop circuit DWN2 is connected to the output node WD of the word line voltage raising circuit WLDV and inputs the sense amplifier activation signals $\phi_{SA}$. The following is a description of the manner in which this circuit lowers the gate voltage of the transfer transistor at the timing of the sense amplifier activation.

The voltage drop circuit DWN2 has the NMOS transistor T70 that has the source connected to the power $V_{cc}$, and the gate and the drain both connected to the node Na, and NMOS transistors T71 and T72 which in the same manner as the transistor T70 have their gates and drains connected to the node Na and the node WD, and which are connected in series between these two nodes. The transistors T71 and T72 are connected so that a current flows from the output node WD to the node Na, and the gate and the drain of the transistor T72 are connected to the node WD. In addition, there are also NMOS transistors T73 and T74 that connect the source and the drain between the nodes Na and the node WD, and the gate of the transistor T73 is connected to the power $V_{cc}$ and the gate of the transistor T74 is connected to the node Nb. Then, one electrode of the capacitor CD is connected to the node Nb, and the other electrode of the capacitor CD inputs the sense amplifier activation signals $\phi_{SA}$. Then, there are also the NMOS transistors T75 and T76 that connect the source and the drain between the node Nb and the node WD, and the gate of the transistor T75 is connected to the node WD, and the gate of the transistor T76 is connected to $V_{cc}$.

The following is a description of the operation of this voltage drop circuit DWN 2, with reference to the timing chart of FIG. 6. Here, for the sake of simplicity, the threshold values of the transistors which configure the voltage drop circuit DWN 2 are all made the same value $V_{tn}$. First, after period t1, when the node WD rises at period t2, that level rises to the level of $V_{cc}+3V_{tn}$ which is the upper limit value determined by the MOS transistors connected in series between the node WD and the power $V_{cc}$. When this occurs, the node Nb which was at 0 V which was the same level as the node WD, because of the operation start transistor T76, is charged to the level of $V_{cc}+2V_{tn}$ by the transistor T75 (period t2 of FIG. 6). Then, when the sense amplifier activation signal $\phi_{SA}$ becomes high, the coupling of the capacitor CD causes the potential of the node Nb to rise to $V_s$ (where $V_s > V_{tn}$) and the transistor T74 turns on. By this, it is possible to have a current path that passes through transistors T70 and T&4 between the power $V_{cc}$ and the node WD, and for the node WD to be discharged to the level of $V_{cc}+V_{tn}$ (period t3 of FIG. 6).

At the end of operation, when the node WD drops from the voltage raised level to 0 V in the same manner as described for the semiconductor integrated circuit device of FIG. 1, the node Na and the node Nb both become 0 V because of the transistors T73 and T76 and are prepared for the following operation (period t4 of FIG. 6). The transistors T73 and T76 are provided for making the initial voltage of the nodes Na and Nb equal to 0 V.

According to the second embodiment as described above, a word line is set to the level of $V_{cc}+V_{tn}$ after the activation of a sense amplifier and the application of a high field to an oxide film of a transfer transistor is prevented, and the word line has its voltage raised to a high level of $V_{cc}+3V_{tn}$ after the activation of a sense amplifier, and the conductance of the transfer transistor is improved. Accordingly, it is possible to realize a semiconductor integrated circuit device that can transfer data at high speed without any loss of reliability.

According to the present invention, it is possible to raise the transfer efficiency and at the same time prevent the destruction of the gate oxide film, by sufficiently raising the gate voltage of a transfer transistor prior to the activation of a sense amplifier, and by lowering that level after activation of a sense amplifier.

What is claimed is:

1. A semiconductor integrated circuit device using a metal oxide semiconductor (MOS) transistor that selects necessary data for the sake of a transfer, comprising:
   a data retention node;
   a data line which is precharged to a required potential for transferring data and which transfers and receives data to and from said data retention node;

a MOS transistor having a source connected to said data line and a drain connected to said data retention node, respectively;

a sense amplifier for amplifying said data which has been transferred from said data retention node to said data line via said MOS transistor so as to hold said data line at an amplified potential;

step-up means for setting a gate potential of said MOS transistor to a first step-up potential; and step-down means for changing a gate potential of said MOS transistor from said first step-up potential to a second step-up potential at a time of activation of said sense amplifier, wherein said second step-up potential is set at a predetermined value at which said MOS transistor can transfer all of said amplified potential of said data line to said data retention node, and wherein an absolute value of said second step-up potential is smaller than an absolute value of said first step-up potential.

2. The semiconductor integrated circuit device according to claim 1, wherein said semiconductor integrated circuit device is comprised of a dynamic random access memory (DRAM), said data retention node corresponds to electrodes of a plurality of memory cell capacitors, said data line corresponds to bit lines, and said MOS transistor corresponds to said memory cell transistors which constitute said memory cell capacitors.

3. The semiconductor integrated circuit device according to claim 1, wherein said step-up means includes a step-up capacitor having a first terminal which receives a step-up signal, and a second terminal which receives an output of said step-up means, wherein said step-down means includes a step-down capacitor having a first terminal which receives a step-down signal, and a second terminal which receives an output of said step-down means, wherein said circuit device includes precharge means for precharging both of said second terminals of said step-up capacitor and said step-down capacitor when both of said step-up signal and said step-down signal are set to a first set-up potential, and wherein said first step-up potential is obtained by changing both of said step-up signal and step-down signal from said first set-up potential to a second set-up potential, and simultaneously thereafter, said second step-up potential is obtained by returning only said step-down signal to said first set-up potential.

4. The semiconductor integrated circuit device according to claim 3, further comprising a shorting MOS transistor which causes to electrically shorten said first terminal of said step-up capacitor with said first terminal of said step-down capacitor whenever said step-up means is reset.

5. The semiconductor integrated circuit device according to claim 3, wherein said MOS transistor comprises an NMOS transistor, and said circuit device has a voltage hold NMOS transistor having a source connected to said first terminal of said step-down capacitor, and having a gate and a drain connected to a power supply ($V_{ss}$), thereby supplying a current from said power supply ($V_{ss}$) to said first terminal of said step-down capacitor.

6. The semiconductor integrated circuit device according to claim 3, wherein said MOS transistor comprises a PMOS transistor and said circuit device has a voltage hold PMOS transistor having a source connected to said first terminal of said step-down capacitor, and having a gate and a drain connected to a power supply ($V_{cc}$), thereby supplying a current from said first terminal of said step-down capacitor to said power supply ($V_{cc}$).

7. The semiconductor integrated circuit device according to claim 1, wherein said MOS transistor comprises a NMOS transistor, and wherein said step-down means comprises:

a first predetermined number of limiter NMOS transistors connected in series to each other, each having a gate and a drain commonly connected to each other in a direction of a current flowing from an output of said step-up means to a power supply ($V_{cc}$); and means for electrically decreasing a desired number of said limiter NMOS transistors connected between said output of said step-up means and said power supply ($V_{cc}$) from said first predetermined number of limiter NMOS transistors to a second predetermined number of limiter NMOS transistors by forming a current path which bypasses a fixed number of said limiter NMOS transistors at said time of activation of said sense amplifier.

8. The semiconductor integrated circuit device according to claim 1, wherein said MOS transistor comprises a PMOS transistor, and wherein said step-down means comprises a first predetermined number of limiter PMOS transistors connected in series to each other, each having a gate and a drain commonly connected to each other, in a direction of a current flowing from a power supply ($V_{ss}$) to an output of said step-up means; and means for electrically decreasing a desired number of said limiter PMOS transistors connected between said output of said step-up means and said power supply ($V_{ss}$) from said first predetermined number of limiter PMOS transistors to a second predetermined number of limiter PMOS transistors by forming a current path which bypasses a fixed number of said limiter PMOS transistors at said time of activation of said sense amplifier.

* * * * *